US009658121B2

United States Patent
Inoue et al.

(10) Patent No.: US 9,658,121 B2
(45) Date of Patent: May 23, 2017

(54) LOAD SENSOR USING VERTICAL TRANSISTOR

(71) Applicant: DENSO CORPORATION, Kariya, Aichi-pref. (JP)

(72) Inventors: Takashi Inoue, Kariya (JP); Kensuke Hata, Kariya (JP); Tetsuya Katoh, Kariya (JP); Kenichi Sakai, Kariya (JP); Mayumi Uno, Izumi (JP); Junichi Takeya, Izumi (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/913,067

(22) PCT Filed: Jul. 30, 2014

(86) PCT No.: PCT/JP2014/004000
§ 371 (c)(1),
(2) Date: Feb. 19, 2016

(87) PCT Pub. No.: WO2015/025480
PCT Pub. Date: Feb. 26, 2015

(65) Prior Publication Data
US 2016/0202132 A1    Jul. 14, 2016

(30) Foreign Application Priority Data
Aug. 22, 2013    (JP) ................. 2013-172293

(51) Int. Cl.
*G01L 1/22*     (2006.01)
*G01L 1/18*     (2006.01)
*H01L 51/05*    (2006.01)

(52) U.S. Cl.
CPC .............. *G01L 1/2293* (2013.01); *G01L 1/18* (2013.01); *H01L 51/057* (2013.01)

(58) Field of Classification Search
CPC ........ G01L 1/2293; G01L 1/18; H01L 51/057
(Continued)

(56) References Cited

U.S. PATENT DOCUMENTS

| 6,154,580 A | 11/2000 | Kuriyama et al. |
| 2006/0043363 A1 | 3/2006 | Miyamoto |

(Continued)

FOREIGN PATENT DOCUMENTS

| JP | 2005-150146 A | 6/2005 |
| JP | 2009-031045 A | 2/2009 |

(Continued)

OTHER PUBLICATIONS

International Search Report of the International Searching Authority dated Sep. 2, 2014 issued in the corresponding International application No. PCT/JP2014/004000 (and English translation).

(Continued)

*Primary Examiner* — Fernando L Toledo
*Assistant Examiner* — Adam S Bowen
(74) *Attorney, Agent, or Firm* — Posz Law Group, PLC (57) ABSTRACT

A load sensor is constituted by a rib and a vertical transistor including an organic semiconductor film, and a load measurement can be executed based on a change of a gap between a drain electrode and a source electrode which is a channel length of the vertical transistor. Therefore, a change of a current Ids is in a linear relationship to a load applied to the load sensor.

6 Claims, 4 Drawing Sheets

(58) Field of Classification Search
USPC .......................................................... 257/257
See application file for complete search history.

(56) References Cited

U.S. PATENT DOCUMENTS

| | | | |
|---|---|---|---|
| 2009/0027352 A1* | 1/2009 | Abele | G06F 3/0412 345/173 |
| 2009/0181493 A1 | 7/2009 | Miyamoto | |
| 2013/0001525 A1 | 1/2013 | Hu et al. | |
| 2013/0020186 A1* | 1/2013 | Lai | G06F 3/045 200/5 A |

FOREIGN PATENT DOCUMENTS

| | | | | |
|---|---|---|---|---|
| JP | 2011-242153 A | 12/2011 | | |
| JP | WO 2013118706 A1 * | 8/2013 | ....... | H01L 21/32139 |
| WO | 2009/133891 A1 | 11/2009 | | |
| WO | 2013/118706 A1 | 8/2013 | | |

OTHER PUBLICATIONS

Written Opinion of the International Searching Authority dated Sep. 2, 2014 issued in the corresponding International application No. PCT/JP2014/004000 (and English translation).

\* cited by examiner

LOAD SENSOR USING VERTICAL TRANSISTOR

CROSS REFERENCE TO RELATED APPLICATIONS

The present disclosure is a U.S. national stage of International Application No. PCT/JP2014/004000 filed on Jul. 30, 2014 and is based on Japanese Patent Application No. 2013-172293 filed on Aug. 22, 2013, the disclosures of which are incorporated herein by reference.

TECHNICAL FIELD

The present disclosure relates to a load sensor using vertical transistor which includes a semiconductor film.

BACKGROUND ART

Conventionally, in a load sensor measuring a surface pressure, wirings crossing each other at right angles are arranged on two surfaces of a sensing rubber that is a film shape, and a load detection is executed based on a change of a resistance of the sensing rubber at a crossing point where a load is applied by using a change of a thickness of the sensing rubber at the crossing point. However, since the load sensor is a simple matrix structure in which the wiring crossing each other at right angles in a matrix shape on the two surfaces of the sensing rubber and executes a load detection by using the simple matrix structure, the load detection is more easily affected by a change of a resistance at another crossing point in a case where a total number of measurement points becomes larger. In this case, an S/N ratio (signal noise ratio) becomes smaller, a measurement accuracy is deteriorated, and a peripheral circuit becomes more complicated in a case where a high-speed measurement is necessary and may be used in a robot.

JP2009-31045A discloses that a horizontal transistor including an organic semiconductor film made of an organic semiconductor material is applied to a load sensor, so as to solve the above matters. The horizontal transistor using the organic semiconductor film executes the load detection based on a change of a current Ids flowing between a drain electrode and a source electrode which is generated due to a change of a thickness of a gate oxidation film generated according to a load applied to the horizontal transistor. Since a current flows through the horizontal transistor until a gate is turned on, in the load sensor using the horizontal transistor, the horizontal transistor is not affected by other horizontal transistors adjacent to the horizontal transistor, the S/N ratio CaO be properly increased, and the measurement accuracy can be improved.

The current Ids is obtained by an expression based on a mobility μ, a gate capacity C, a gate width W, a gate length L, a gate voltage Vg, and a threshold voltage Vth. According to the above expression, when a thickness of the gate oxidation film is changed, parameters including the mobility μ, the gate capacity C, and the gate length L are affected. Therefore, the current Ids flowing between the drain electrode and the source electrode is changed in a non-linear relationship.

$$Ids = \frac{W \times \mu \times C}{2 \times L}(Vg - Vth)^2$$

In this case, to apply the horizontal transistor to the load sensor, a reference load is applied to the horizontal transistor, and the current Ids is measured and is established to a map and a table. That is, the current Ids of when a load is applied to the horizontal transistor is measured, a stored load in the table corresponding to the current Ids is loaded to measure the load. As the above description, when the current Ids is changed in a non-linear relationship to the load, it is necessary to establish a table by measuring the reference load, and a manufacturing of a product becomes complicated.

PRIOR ART LITERATURES

Patent Literature

Patent Literature 1: JP2009-31045A

SUMMARY OF INVENTION

The present disclosure is made in view of the above matters, and it is an object of the present disclosure to provide a load sensor in which a current between a drain electrode and a source electrode is changed in a linear relation to a load applied to the load sensor.

According to an aspect of the present disclosure, a load sensor using a vertical transistor includes a substrate, a rib, a transistor, a bottom electrode layer, and a top electrode layer. The substrate includes a surface that is an insulator. The rib arranged on the substrate includes a surface including a side surface and a top surface. The surface is an insulator. The rib is made of a material different from a material of the substrate. The transistor includes a gate electrode that is arranged on the side surface of the rib, a gate insulating film, and a semiconductor film. The bottom electrode layer is arranged on a bottom surface of a recession and is in contact with the semiconductor film, and the recession is a part of the substrate where the rib is arranged. The top electrode layer is arranged on a top surface of a protrusion and is in contact with the semiconductor film, and the protrusion is a part of the substrate where the rib is not arranged. When a gate voltage is applied to the gate electrode, a channel area is generated in the semiconductor film, and a current flows between the bottom electrode layer and the top electrode layer. When a load is applied to the protrusion, a length of the semiconductor film is changed in a direction parallel to a height of the rib according to a deformation of the rib, and the transistor executes a load measurement based on a change of the current.

Therefore, the load sensor is constituted by the rib and the vertical transistor including the organic semiconductor film. Further, a load measurement is executed, based on a change of a gap between a drain electrode and a source electrode which are the bottom electrode layer and the top electrode layer which is a channel length of the vertical transistor, and a change of a length of the semiconductor film constituting the channel area. In this case, the change of the current flowing between the drain electrode and the source electrode is in a linear relationship to the load applied to the load sensor. Thus, the load sensor in which the current flowing between the drain electrode and the source electrode is changed in a linear relationship to the load applied to the load sensor can be provided.

BRIEF DESCRIPTION OF THE DRAWINGS

Hereafter, referring to drawings, embodiments of the present disclosure will be described. In addition, the substantially same parts and components are indicated with the same reference numeral in following embodiments. In the drawings.

DESCRIPTION OF EMBODIMENTS

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereafter, referring to drawings, embodiments of the present disclosure will be described. In addition, the substantially same parts and components are indicated with the same reference numeral in following embodiments.

(First Embodiment)

Figure 1:
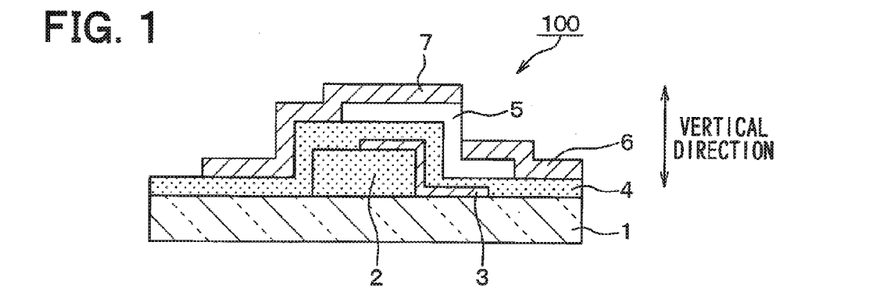
FIG. 1 is a cross-sectional diagram showing a load sensor using a vertical transistor, according to a first embodiment of the present disclosure.
Figure 2:
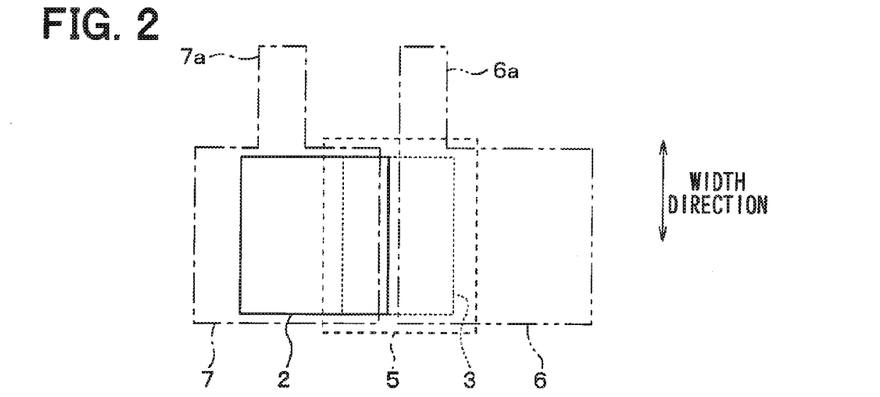
FIG. 2 is a top view of the load sensor using the vertical transistor shown in FIG. 1.

A first embodiment of the present disclosure will be described. According to the present embodiment, a load sensor includes a vertical transistor including an organic semiconductor film. Referring to FIGS. 1 and 2, a structure of the load sensor using the vertical transistor will be detailed.

As shown in FIG. 1, the load sensor 100 using the vertical transistor according to the present embodiment is arranged on a substrate 1 that is an insulating substrate in which at least a surface is an insulator. The insulating substrate may be a glass or a plastic film. Specifically, the load sensor 100 has the structure as followings.

A rib 2 is arranged on the substrate 1. The rib 2 is made of a material that has a Young's modulus smaller than that of the substrate 1 and is more readily deformed than the substrate 1. According to the present embodiment, the rib 2 may be made of an insulating material that is used as a photoresist such as a SU-8 photoresist or a polydimethylsiloxane (PDMS). According to the present embodiment, the rib 2 is a quadrangle in a cross-sectional diagram shown in FIG. 1, and a top surface of the rib 2 is also a quadrangle. Specifically, the top surface of the rib 2 is a square in which a length of a side is 2 mm, and a height of the rib 2 that is a dimension in a thickness direction is greater than or equal to 1 µm. According to the present embodiment, the height of the rib 2 is set to 50 µm. As shown in FIG. 2, the rib extends in a width direction. Au and Cr are accumulated on a side surface of the rib 2 in order as a conductive layer that is a gate electrode 3. According to the present embodiment, a film in which a thickness of Au is 60 nm and a thickness of Cr is 3 nm is formed to be the gate electrode 3. Plural of the ribs 2 and plural of the gate electrodes 3 are arranged in an equal interval or in a matrix shape, and positions where the ribs 2 are arranged are protrusions and positions where the ribs 2 are not arranged are recessions.

A gate insulating film 4 is arranged on a surface of the substrate 1 and a surface of the rib 2 and the gate electrode 3, and the gate insulating film 4 is made of an insulating material such as a Parylene (a registered trademark), a $SiO_2$, an alumina, or an organic material. According to the present embodiment, a thickness of the gate insulating film 4 is 450 nm. An organic semiconductor film 5 extends from a surface of the gate insulating film 4 on the side surface of the rib 2 to a position on top of the rib 2 and to a position where the rib 2 is not arranged. The organic semiconductor film 5 is made of a high molecular organic material, a low molecular organic material, or an organic semiconductive material including an accumulating structure in which the high molecular organic material and the low molecular organic material are accumulated.

A bottom electrode layer 6 is arranged on a bottom surface of the recession of the organic semiconductor film 5 that is a position on top of the substrate 1 where the rib 2 is not arranged. The bottom electrode layer 6 is in contact with the organic semiconductor film 5 and is made of an electrode material such as Au. A top electrode layer 7 is arranged on a top surface of the protrusion of the organic semiconductor film 5 that is a position on top of the substrate 1 where the rib 2 is arranged. The top electrode layer 7 is in contact with the organic semiconductor film 5 and is made of an electrode material such as Au. The bottom electrode layer 6 and the top electrode layer 7 are arranged to be separated from each other, and the bottom electrode layer 6 and the top electrode layer 7 are electrically separated from each other. According to the present embodiment, a thickness of the bottom electrode layer 6 and a thickness of the top electrode layer 7 are 20 nm.

As shown in FIG. 2, the bottom electrode layer 6 and the top electrode layer 7 are quadrangles which have the same width as the side surface of the rib 2 where the gate electrode 3 is arranged. The bottom electrode layer 6 includes a first leading-out wiring portion 6a extending in a width direction shown in FIG. 2 along the surface of the substrate 1, and the top electrode layer 7 includes a second leading-out wiring portion 7a extending in the width direction along the surface of the substrate 1. Since the bottom electrode layer 6 is arranged on top of the recession of the substrate 1 where the rib 2 is not arranged, the first leading-out wiring portion 6a of the bottom electrode layer 6 extends from the recession. The top electrode layer 7 is basically arranged on top of the protrusion where the rib 2 is arranged. In this case, the top electrode layer 7 is arranged on side surfaces of the rib 2 other than the side surface where the gate electrode 3 is arranged, and the top electrode layer 7 extends to a position on the substrate 1 below the rib 2, such that the second leading-out wiring portion 7a of the top electrode layer 7 extends from the substrate 1.

According to the above structure, the load sensor 100 using the vertical transistor according to the present embodiment is configured. In the load sensor 100 using the vertical transistor, one of the bottom electrode layer 6 and the top electrode layer 7 is a drain electrode, and the other of the bottom electrode layer 6 and the top electrode layer 7 is a source electrode. When a gate voltage that is predetermined is applied to the gate electrode 3, the vertical transistor generates a channel area at a position of the organic semiconductor film 5 between the drain electrode and the source electrode. Thus, an operation that a current Ids flows through the side surface of the rib 2 between the drain electrode and the source electrode via the channel area is executed, Conventionally, the current Ids is obtained by an expression (1) based on a mobility μ, a gate capacity C, a gate width W, a gate length L, a gate voltage Vg, and a threshold voltage Vth. According to the expression (1), when a thickness of a gate oxidation film is changed, parameters including the mobility μ, the gate capacity C, and the gate length L are affected. Therefore, the current Ids flowing between the drain electrode and the source electrode is changed in a non-linear relationship.

$$Ids = \frac{W \times \mu \times C}{2 \times L}(Vg - Vth)^2 \quad (1)$$

Figure 3:
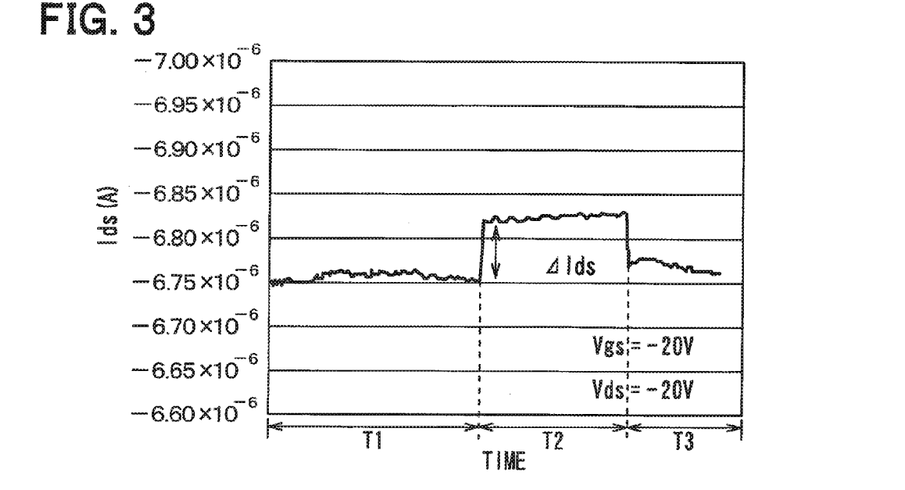
FIG. 3 is a graph showing a change of a current Ids of when a load is applied to the load sensor.
Figure 4:
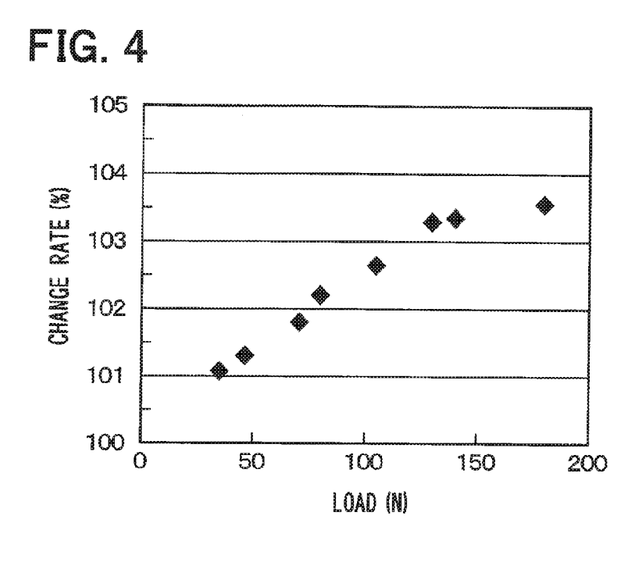
FIG. 4 is a graph showing a relationship between the load and a rate of the change of the current Ids.

In this case, when a load is applied to the load sensor 100 in a vertical direction shown in FIG. 1, the rib 2 is deformed according to the load. Therefore, the height of the rib 2 becomes smaller, a minimum distance of a part of the organic semiconductor film 5 placed between the bottom electrode layer 6 and the top electrode layer 7 becomes shorter, and a channel length becomes shorter. In this case, when the channel length becomes shorter, a channel resistance becomes smaller, and the current Ids becomes larger. A load measurement can be executed based on a change of the current Ids. Specifically, the change of the current Ids of when the load is applied to the load sensor 100 according to the present embodiment is indicated as shown in FIG. 3. When an area of the top surface of the rib 2 is 2 mm×2 mm, a size of the transistor is L/W=50 μm/2000 μm, Vgs is −20 V, and Vds is −20 V, the load is measured. The load is zero in a time period T1 and a time period T3, and the load is 30 N in a time period T2. Further, a relationship between the load and a change rate of the current Ids is indicated as shown in FIG. 4. The change rate of the current Ids is obtained by an expression (2).

$$\Delta Ids = \frac{Iave2}{Iave1} \times 100 \quad (2)$$

In the expression (2), Iave2 indicates an average value of the current Ids in the time period T2, and Iave1 indicates an average value of the current Ids in the time period T1. According to the present embodiment, the average value of the current Ids in the time period T1 is referred to as an average current value level, the average value of the current Ids in the time period T2 is referred to as an average current value Iave2, and an average value of the current Ids in the time period T3 is referred to as an average current value level As shown in FIG. 3, the current Ids is increased from the time period T1 before the load is applied to the load sensor 100 to the time period T2 where the load is applied to the load sensor 100, and the current Ids is decreased from the time period T2 to the time period T3 where the load is removed. Further, the average current value level in the time period T1 is substantially equal to the average current value Iave3 in the time period T3. Thus, the load measurement can be executed based on the change of the current Ids.

As shown in FIG. 4, the change rate of the current Ids is changed to be substantially proportional to the load. Specifically, when the load is from 30 N to 150 N, the change rate of the current Ids is changed to be proportional to the load. The change of the current Ids relative to the load is mainly generated based on a change of a length of the organic semiconductor film 5 that constitutes the channel area.

Conventionally, when the load sensor uses a horizontal transistor, since the current Ids is changed based on a change of a thickness of a gate insulating film relative to a load, the load is measured based on a change of the current Ids. However, since the thickness of the gate insulating film is changed, parameters including the mobility μ, the gate capacity C, and the gate length L in the expression (1) are affected. In this case, when the horizontal transistor is applied to the load sensor, the current Ids flowing between a drain electrode and a source electrode is changed in a non-linear relationship.

In contrast, according to the present embodiment, the load sensor 100 includes the vertical transistor, and the load measurement can be executed based on a change of the channel length and a change of the mobility in the vertical transistor. When a change rate of the strain is smaller than or equal to 7%, a change rate of the channel length becomes smaller, and the change rate of the channel length is proportional to the change rate of the current Ids in a range where the change rate of the strain is smaller than or equal to 7%. The mobility of the transistor is improved when a position relationship between molecules constituting an organic semiconductor layer is changed by the load and a transfer integral becomes larger. Thus, when the strain of the channel area is small, the mobility is also proportional to a change of the load. As shown in FIG. 4, the change rate is linear in a range where the load is from 30 N to 150 N. In this case, when the load is a maximum load that is 150 N, the strain of the rib 2 is 1.5%.

Thus, according to the present embodiment, since the vertical transistor constitutes the load sensor 100, the current Ids can be changed in a linear relationship to the load applied to the load sensor 100. Therefore, it is unnecessary to establish a table by measuring an actual load, and a manufacturing of a product can be simplified. In this case, the table is necessary in a conventional technology.

Figure 5:
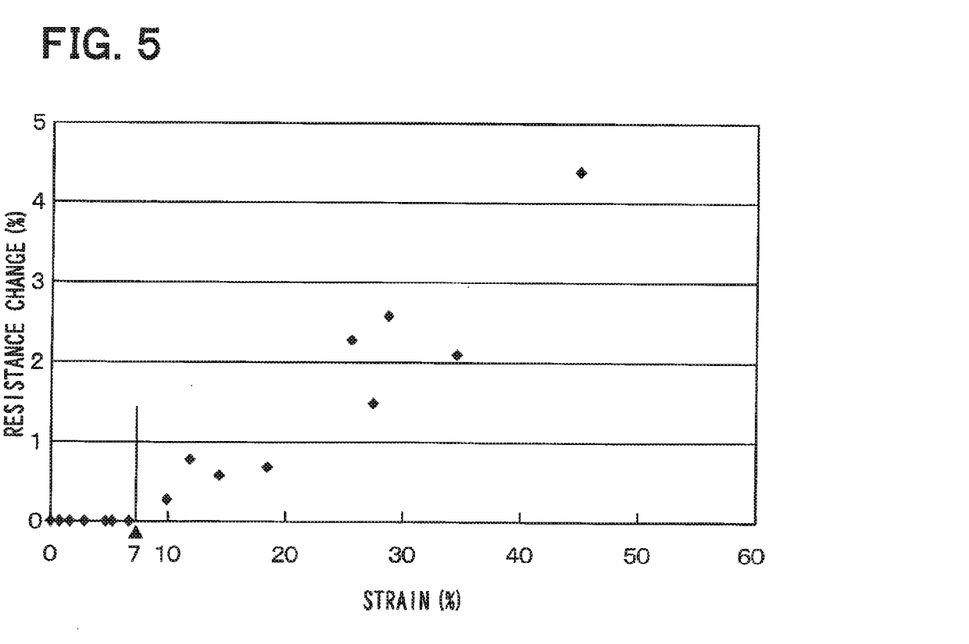
FIG. 5 is a graph showing a relationship between a strain of a rib and a change of a resistance of a metal wiring.

As the above description, when the load is from 30 N to 150 N, the current Ids is changed to be proportional to the load. However, when the load exceeds 150 N, a gap is generated in a proportional relationship between the current Ids and the load. When the rib 2 is deformed in a case where the load is applied to the load sensor 100, the bottom electrode layer 6 or the top electrode layer 7 is pressed and crushed, and a resistance of a metal wiring connected with the bottom electrode layer 6 or the top electrode layer 7 is changed. A change of the resistance of the metal wiring relative to the strain of the rib 2 which is generated due to the load is indicated as shown in FIG. 5. According to the present embodiment, the change of the resistance of the metal wiring is referred to as a resistance change of the metal wiring. The strain of the rib 2 is a change rate of the height of the rib 2 changed according to the load. The resistance change of the metal wiring is a resistance change rate of the wiring arranged between bottom portions of the substrate 1 in a case where a material constituting the gate electrode 3 is formed by spanning the rib 2. That is, the resistance change of the metal wiring is not generated until the strain of the rib 2 becomes 7%. However, when the strain of the rib 2 becomes 10%, an increasing of the resistance of the metal wiring is generated, and the resistance change increases in accordance with an increase in strain. Thus, the material of the rib 2 is selected such that the change rate of the height of the rib 2 is smaller than or equal to 10% in a case where the maximum load considered as a measurement subject is applied to the load sensor 100. Further, it is preferable that the material of the rib 2 is selected such that the change rate of the height of the rib 2 is smaller than or equal to 7% in a case where the maximum load considered as the measurement subject is applied to the load sensor 100, so as to adjust the Young's modulus of the rib 2. To adjust a range of the load, an area of the rib 2 may be changed. For example, when an organic film transistor is arranged on a side surface of a wall of the rib 2 adjacent to a length that is 4 mm in a case where the area of the rib 2 is 2 mm×4 mm, the area of the rib 2 becomes twice as the rib 2 when the area of the rib 2 is 2 mm×2 mm. In this case, the rib 2 having the area that is 2 mm×4 mm can ensure the linear relationship in a case where the load is 300 N that is twice as the load when the rib 2 having the area that is 2 mm×2 mm. Further, since a width of the transistor when the rib 2 having the area that is 2 mm×4 mm becomes twice as that of when the rib 2 having the area that is 2 mm×2 mm, the current Ids also becomes twice, and the S/N ratio (signal noise ratio) can be improved.

According to the present embodiment, the strain of the rib 2 satisfies the above relationships, and the Young's modulus of the rib 2 is smaller than that of the substrate 1. In this case, when the load is applied to the load sensor 100, the rib 2 is deformed and the substrate 1 is not deformed.

According to the present embodiment, the height of the rib 2 is set to a value larger than or equal to 1 µm, and the height of the rib 2 is smaller than a length of a side of the rib 2. Since the height of the rib 2 is smaller than the length of the side of the rib 2, the side surface of the rib 2 is difficult to receive the load, and the rib 2 is deformed only by the load applied to the top surface of the rib 2. Since the height of the rib 2 is set to a value larger than or equal to 1 µm, the measurement subject applying the load to the load sensor 100 is not in contact with the recession of the substrate 1 where the rib 2 is not arranged. Therefore, all of the load can be received by the top surface of the rib 2, and the load measurement can be accurately executed.

Figure 6:
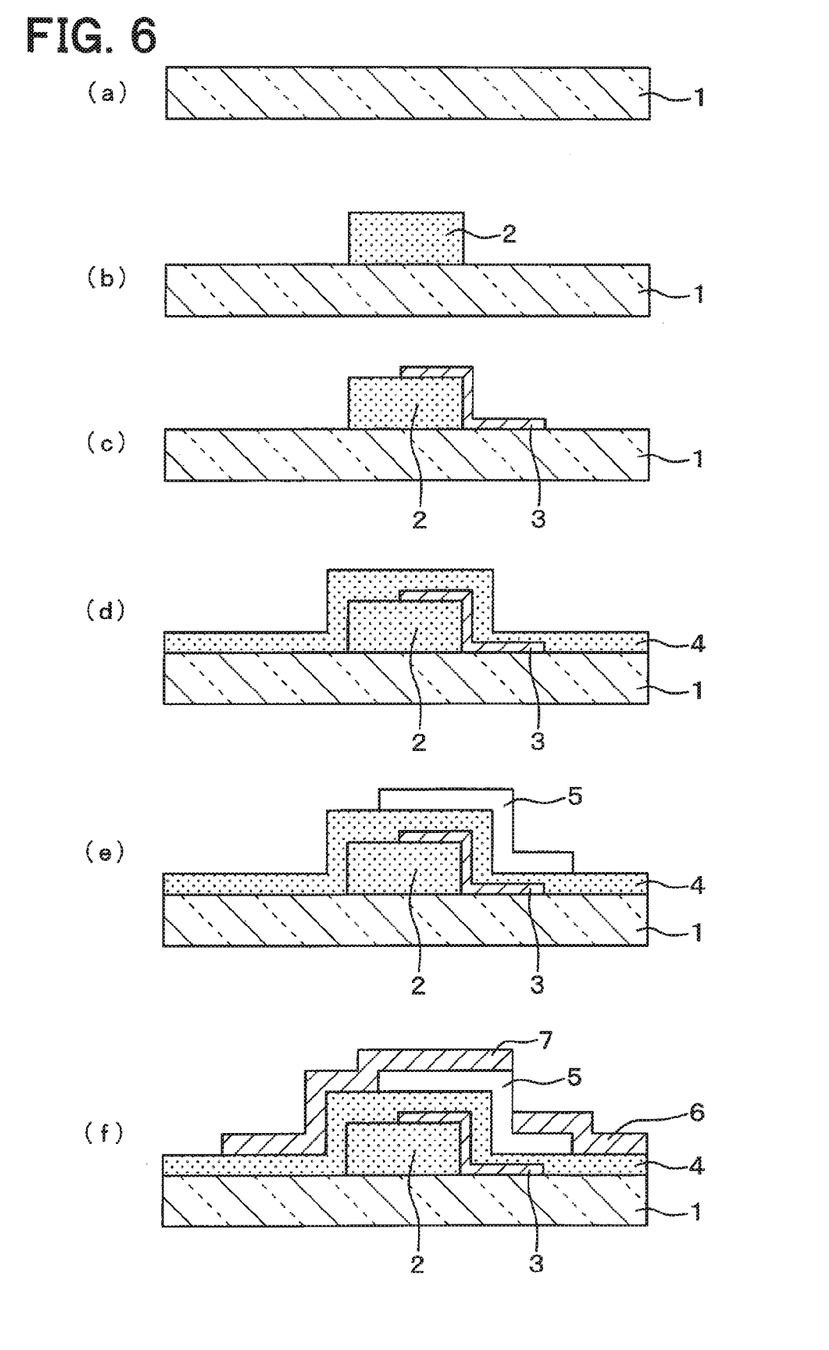
FIG. 6 is a cross-sectional diagram showing a manufacturing process of the vertical resistor shown in FIG. 1.

Next, a manufacturing method of the vertical resistor according to the present embodiment will be described referring to cross-sectional diagrams indicating manufacturing steps as shown in FIG. 6.

First, as shown in FIG. 6(a), the substrate 1 that is an insulating substrate such as a glass is provided. Then, as shown in FIG. 6(b), an insulating layer made of a material that is an insulating material such as a SU-8 and has a Young's modulus smaller than that of the substrate 1 is formed to have a thickness that is 50 µm. For example, the insulating layer can be formed by a spin coating. Then, the insulating layer is patterned, and the rib 2 having the top surface that is a square that is 2 mm×2 mm is formed, by photo-etching. Alternatively, the rib 2 may be formed by printing.

Next, as shown in FIG. 6(c), Au is formed to have a thickness that is 60 nm and Cr is formed to have a thickness that is 3 nm, by spattering on the surface of the substrate 1 including the surface of the rib 2. Au and Cr are patterned to form the gate electrode 3. In this case, when the side surface of the rib 2 is vertical, it is difficult to form the gate electrode 3 on the side surface of the rib 2 by forming a material of the gate electrode 3 to a film extending in a vertical direction relative to the substrate 1. It is preferable that the material of the gate electrode 3 is spattered in a tilted direction, and the gate electrode 3 is easy to be formed on the side surface of the rib 2.

Next, as shown in FIG. 6(d), the gate insulating film 4 is formed to have a thickness that is 450 nm, by forming an insulating material such as a Parylene, a SiO2, an alumina, or an organic material to a film. For example, a trimethylaluminum is used as a base material. When the gate insulating film 4 is formed by an atom layer deposition method (ALD method), the gate insulating film 4 can be formed to a film at a low-temperature process in which a temperature is about 90 degrees Celsius. When the low-temperature process is used, since it is unnecessary to expose the rib 2 having a heat-resisting property that is insufficient to a high-temperature environment, the rib 2 can be protected from the high-temperature environment. When the substrate 1 is a substrate constituted by a glass, a heat-resisting property of the substrate 1 is sufficient. However, the substrate 1 can be a resin substrate that is insulator. When the resin substrate is used as the substrate 1, since a heat-resisting property of the substrate 1 is insufficient, it is effective that the gate insulating film 4 is formed to a film by the low-temperature process.

Then, as shown in FIG. 6(e), an organic semiconductor material is formed to a film having a thickness that is 120 nm at a forming speed that is 0.6 Å/sec to 0.8 Å/sec by a vapor deposition. Then, the organic semiconductor material is patterned to form the organic semiconductor film 5. Then, as shown in FIG. 6(f), an electrode material constituting the bottom electrode layer 6 and the top electrode layer 7 is formed to a film at a forming speed that is 0.5 Å/sec to 0.8 Å/sec by a spattering or a vacuum vapor deposition that uses a shadow mask. In this case, it is possible that the electrode material is not formed to a film at a part of the organic semiconductor film 5 which is the channel area by a method of forming a film. For example, when the spattering or the vapor deposition is executed in the vertical direction, the electrode material is not formed to a film at a surface of the organic semiconductor film 5 that is perpendicular to the surface of the substrate 1. In this case, the surface of the organic semiconductor film 5 is the channel area. Thus, the bottom electrode layer 6 and the top electrode layer 7 can be self-separated on the organic semiconductor film 5.

When the electrode material is formed to a film in the channel area, a photo-etching process may be executed and the bottom electrode layer 6 and the top electrode layer 7 may be patterned, as necessary. When the bottom electrode layer 6 and the top electrode layer 7 are formed, the load sensor 100 using the vertical transistor shown in FIGS. 1 and 2 according to the present embodiment is manufactured.

According to the present embodiment, the load sensor 100 is constituted by the rib 2 and the vertical transistor including the organic semiconductor film 5, and the load measurement can be executed based on a change of a gap between the drain electrode and the source electrode which is the channel length of the vertical transistor. In this case, the change of the current Ids is in the linear relationship to the load applied to the load sensor 100. Therefore, it is unnecessary to establish the table by measuring the actual load, and the manufacturing of the product can be simplified. In this case, the table is necessary in the conventional technology.

(Second Embodiment)

A second embodiment of the present disclosure will be described. According to the present embodiment, a shape of the rib 2 is changed relative to that of the first embodiment.

Since other parts are as the same as the first embodiment, features of the part different from the first embodiment will be detailed.

Figure 7:
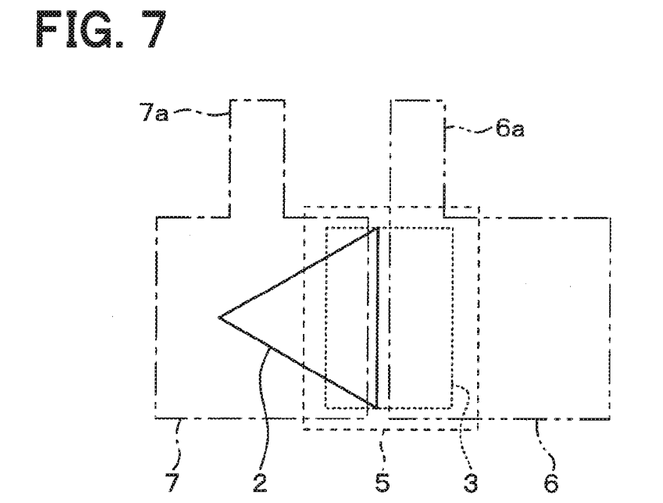
FIG. 7 is a top view of the load sensor using the vertical transistor, according to a second embodiment of the present disclosure.

As shown in FIG. 7, according to the present embodiment, the top surface of the rib 2 is a triangle, the gate electrode 3 and the organic semiconductor film 5 are arranged at one of three sides that is the side surface of the rib 2, and then the channel area is formed. When the rib 2 is a triangle, the area of the top surface of the rib 2 is smaller than the area of the top surface of the rib 2 in the first embodiment in which the rib 2 is a quadrangle. When the area of the top surface of the rib 2 is smaller, a ratio of a transistor area to the area of the top surface of the rib 2 becomes larger, and a ratio of the channel area becomes larger. In this case, a total number of the ribs 2 arranged on the substrate 1 is larger than that of the ribs 2 in the first embodiment, and an accuracy of the load measurement can be improved.

(Third Embodiment)

A third embodiment of the present disclosure will be described. According to the present embodiment, a shape of the rib 2 is changed relative to that of the first embodiment and the second embodiment. Since other parts are as the same as the first embodiment and the second embodiment, features of the part different from the first embodiment will be detailed.

Figure 8:
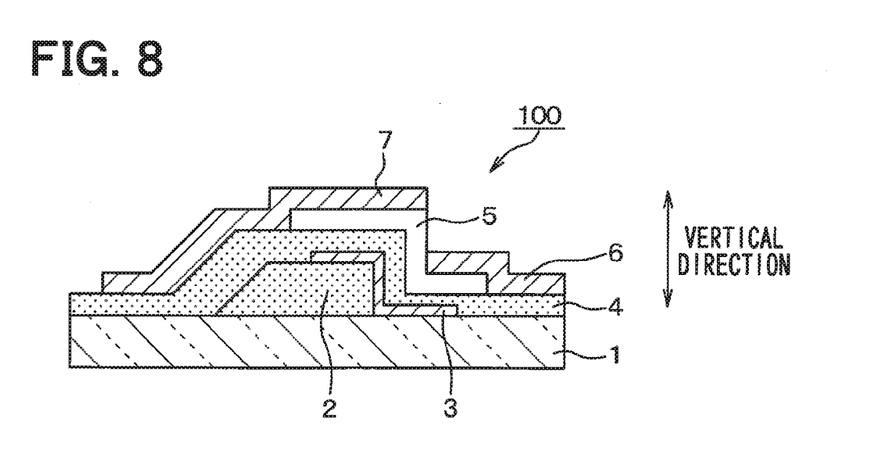
FIG. 8 is a cross-sectional diagram showing the load sensor using the vertical transistor, according to a third embodiment of the present disclosure.

As shown in FIG. 8, according to the present embodiment, at least a part of one or more surfaces of the rib 2 which are different from the side surface of the rib 2 on which the gate electrode 3 is arranged is tapered. As shown in FIG. 8, the top surface of the rib 2 is a quadrangle as the same as the first embodiment. However, according to the present embodiment, the top surface of the rib 2 may be a triangle.

When a part of the rib 2 is tapered, an angle between the top surface and the side surface of the rib 2 in this part, or angle between the side surface of the rib 2 and the surface of the substrate 1 in this part, becomes an obtuse angle. In this case, it can be suppressed that the top electrode layer 7 arranged on a part of the rib 2 which is tapered becomes a thin wall at a boundary position between the top surface of the rib 2 and the side surface of the rib 2 or a boundary position between the side surface of the rib 2 and the substrate 1. In this case, a snap of the top electrode layer 7 can be suppressed.

Further, the patterning of the rib 2 may be executed twice to form the above rib 2. That is, the patterning includes an isotropic etching executed at a part of the rib 2 which is tapered, and an anisotropic etching executed at a side surface of the rib 2 which is perpendicular to the substrate 1. When the part of the rib 2 which is tapered is formed, a material of the bottom electrode layer 6 and the top electrode layer 7 may be sputtered in the vertical direction relative to the substrate 1 in a case where the bottom electrode layer 6 and the top electrode layer 7 are formed. Thus, the material of the bottom electrode layer 6 and the top electrode layer 7 is not adhered to the side surface of the rib 2 which is perpendicular to the surface of the substrate 1, and the material is adhered to the part of the rib 2 which is tapered. In this case, the bottom electrode layer 6 and the top electrode layer 7 can be self-separated on the organic semiconductor film 5.

Other Embodiment

The present disclosure is not limited to the embodiment mentioned above, and can be applied to various embodiments within the spirit and scope of claims of the present disclosure.

According to the above embodiments, a device with a top contact structure in which the bottom electrode layer 6 and the top electrode layer 7 are arranged on the organic semiconductor film 5 is an example. However, a bottom contact structure in which the bottom electrode layer 6 and the top electrode layer 7 are arranged under the organic semiconductor film 5 may be used. A shape of the top surface of the rib 2 may be a polygon other than a quadrangle and a triangle, or may be other shapes. According to the above embodiments, a bottom gate structure in which the gate electrode 3, the gate insulating film 4 arranged on a surface of the gate electrode 3, and the organic semiconductor film 5 arranged on the gate insulating film 4 which are arranged in this order from the substrate 1 is described as a structure of an organic transistor. However, the structure of the organic transistor may be a top gate structure in which the above elements are reversely arranged relative to the bottom gate structure.

A material of an element of the vertical transistor constituting the load sensor 100 may be properly changed. According to the above embodiments, the glass is used as the substrate 1. However, a substrate in which at least a surface is an insulator may be used. For example, a silicon substrate with an insulating film arranged on a surface may be used. Similarly, in the rib 2, at least the surface is an insulator or an insulating film. According to the above embodiments, as the vertical transistor, a semiconductor layer includes an organic film. However, an oxide such as ZnO may be used as the vertical transistor. The gate insulating film 4 may be a nitride such as SiN.

While the present disclosure has been described with reference to the embodiments thereof, it is to be understood that the disclosure is not limited to the embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

The invention claimed is:

1. A load sensor using a vertical transistor, comprising:
a substrate including a surface that is an insulator;
a rib arranged on the substrate, the rib including a surface including a side surface and a top surface, the surface that is an insulator, the rib being made of a material different from a material of the substrate and the rib having a Young's modulus smaller than that of the substrate;
a transistor including a gate electrode that is arranged on the side surface of the rib, a gate insulating film, and a semiconductor film;
a bottom electrode layer arranged on a bottom surface of a recession and being in contact with the semiconductor film, the recession that is a part of the substrate where the rib is arranged; and
a top electrode layer arranged on a top surface of a protrusion and being in contact with the semiconductor film, the protrusion that is a part of the substrate where the rib is not arranged, wherein
when a gate voltage is applied to the gate electrode, a channel area is generated in the semiconductor film, and a current flows between the bottom electrode layer and the top electrode layer, and
when a load is applied to the protrusion, a length of the semiconductor film is changed in a direction parallel to a height of the rib according to a deformation of the rib, and the transistor executes a load measurement based on a change of the current.

2. The load sensor using the vertical transistor according to claim 1, wherein the side surface of the rib where the gate electrode is arranged is perpendicular to a surface of the substrate, a surface of the rib that is different from the side surface of the rib is tapered, and the top electrode layer extends from the top surface of the rib to the surface of the rib and to a part of the substrate where the rib is not arranged.

3. A load sensor using a vertical transistor, comprising:

a substrate including a surface that is an insulator;

a rib arranged on the substrate, the rib including a surface including a side surface and a top surface, the surface that is an insulator, the rib being made of a material different from a material of the substrate, the top surface of the rib being a quadrangle or a triangle;

a transistor including a gate electrode that is arranged on the side surface of the rib, a gate insulating film, and a semiconductor film;

a bottom electrode layer arranged on a bottom surface of a recession and being in contact with the semiconductor film, the recession that is a part of the substrate where the rib is arranged; and a top electrode layer arranged on a top surface of a protrusion and being in contact with the semiconductor film, the protrusion that is a part of the substrate where the rib is not arranged, wherein when a gate voltage is applied to the gate electrode, a channel area is generated in the semiconductor film, and a current flows between the bottom electrode layer and the top electrode layer, and when a load is applied to the protrusion, a length of the semiconductor film is changed in a direction parallel to a height of the rib according to a deformation of the rib, and the transistor executes a load measurement based on a change of the current.

4. The load sensor using the vertical transistor according to claim 3, wherein the side surface of the rib where the gate electrode is arranged is perpendicular to a surface of the substrate, a surface of the rib that is different from the side surface of the rib is tapered, and the top electrode layer extends from the top surface of the rib to the surface of the rib and to a part of the substrate where the rib is not arranged.

5. A load sensor using a vertical transistor, comprising:

a substrate including a surface that is an insulator;

a rib arranged on the substrate, the rib including a surface including a side surface and a top surface, the surface that is an insulator, the rib being made of a material that a change rate of the height of the rib is smaller than or equal to 7% in a case where a maximum load considered as the measurement subject is applied to the rib, the material of the rib being different from a material of the substrate;

a transistor including a gate electrode that is arranged on the side surface of the rib, a gate insulating film, and a semiconductor film;

a bottom electrode layer arranged on a bottom surface of a recession and being in contact with the semiconductor film, the recession that is a part of the substrate where the rib is arranged; and a top electrode layer arranged on a top surface of a protrusion and being in contact with the semiconductor film, the protrusion that is a part of the substrate where the rib is not arranged, wherein when a gate voltage is applied to the gate electrode, a channel area is generated in the semiconductor film, and a current flows between the bottom electrode layer and the top electrode layer, and when a load is applied to the protrusion, a length of the semiconductor film is changed in a direction parallel to a height of the rib according to a deformation of the rib, and the transistor executes a load measurement based on a change of the current.

6. The load sensor using the vertical transistor according to claim 5, wherein the side surface of the rib where the gate electrode is arranged is perpendicular to a surface of the substrate, a surface of the rib that is different from the side surface of the rib is tapered, and the top electrode layer extends from the top surface of the rib to the surface of the rib and to a part of the substrate where the rib is not arranged.

* * * * *